US011403508B1

(12) United States Patent
Ahn et al.

(10) Patent No.: US 11,403,508 B1
(45) Date of Patent: Aug. 2, 2022

(54) METHOD FOR ESTIMATING LOAD BY ENERGY METER INCLUDING LOAD ESTIMATION MODEL BASED ON NEURAL NETWORK AND ENERGY METER USING THE SAME

(71) Applicant: STARKOFF co., ltd., Seoul (KR)

(72) Inventors: Hyun Kwon Ahn, Seoul (KR); Tae Hyo Ahn, Seoul (KR); Dong Hoon Lee, Seoul (KR); Hong Mo Kim, Gwangmyeong-si (KR)

(73) Assignee: STARKOFF co., ltd., Seoul (KR)

( * ) Notice: Subject to any disclaimer, the term of this patent is extended or adjusted under 35 U.S.C. 154(b) by 0 days.

(21) Appl. No.: 17/502,879

(22) Filed: Oct. 15, 2021

(51) Int. Cl.
*G06N 3/04* (2006.01)
*G06N 3/08* (2006.01)
*H02J 13/00* (2006.01)
*G06Q 50/06* (2012.01)
*H02J 3/00* (2006.01)

(52) U.S. Cl.
CPC .............. *G06N 3/04* (2013.01); *G06N 3/08* (2013.01); *G06Q 50/06* (2013.01); *H02J 13/00002* (2020.01); *H02J 13/00007* (2020.01); *H02J 3/003* (2020.01); *H02J 2203/20* (2020.01); *Y10S 706/902* (2013.01)

(58) Field of Classification Search
None
See application file for complete search history.

(56) References Cited

U.S. PATENT DOCUMENTS

| | | | |
|---|---|---|---|
| 2014/0277788 A1* | 9/2014 | Forbes, Jr. | G05B 15/02 700/286 |
| 2016/0154389 A1* | 6/2016 | Drees | G06Q 10/06 700/291 |

* cited by examiner

*Primary Examiner* — Mohammad Ali
*Assistant Examiner* — Saad M Kabir
(74) *Attorney, Agent, or Firm* — Young Basile Hanlon & MacFarlane, P.C.

(57) ABSTRACT

A method for estimating load by energy meter including a load estimation model based on a neural network includes steps of: (a) the energy meter generating sampled supply electric power information by sampling information on electric power based on a predetermined sampling rate; (b) the energy meter instructing the load estimation model to output load information; and (c) the energy meter (i) transmitting the load information and information on an amount of the electric energy to a data management server and (ii) instructing the data management server to monitor the information on the amount of the electric energy, information on each sub-electric power for each of the loads, and information on each sub-amount of the electric energy for each of the loads.

18 Claims, 6 Drawing Sheets

METHOD FOR ESTIMATING LOAD BY ENERGY METER INCLUDING LOAD ESTIMATION MODEL BASED ON NEURAL NETWORK AND ENERGY METER USING THE SAME

TECHNICAL FIELD

The present disclosure relates to an energy meter, and more particularly, to a method for estimating one or more loads, being operated by a customer, by using a load estimation model based on a neural network and the energy meter using the same.

BACKGROUND

In order to check an amount of electric energy calculated by integrating the electric power supplied to a customer through a conventional energy meter installed at the customer, an electrical meterman had to visit the customer and check the conventional energy meter. However, recently, power providers adopt Automatic Meter Readings (AMR) or Advanced Metering Infrastructure (AMI) technology which remotely checks the amount of electric energy.

In order to make the electric energy be consumed more efficiently, the power providers are attempting to predict any changes in the electric power demands by identifying various loads being operated by various customers and analyzing the changes in respective amounts of the electric power or the electric energy based on the operations of the respective loads.

In order to identify each of the loads, multiple pieces of information on the respective amounts of the electric power or the electric energy should be obtained in real-time from each of the customers.

Also, in order to obtain the multiple pieces of information on the respective amounts of the electric power or the electric energy in real-time, it is necessary to install communication devices, each of which guarantees a sufficient bandwidth (BW) for each of the customers.

However, since it is realistically difficult to install the communication devices to all of the customers, many power providers try to acquire the multiple pieces of information on the respective amounts of electric power or the electric energy from the customers by using Power Line Communication (PLC) technology.

However, according to the PLC technology, the amount of information that can be transmitted from the conventional energy meter to a conventional data management server managed by a power provider may be limited. This is because the BW is very narrow in at least a partial section of the communication network which connects the conventional energy meter and the conventional data management server of the power provider.

Thus, the conventional technology has a problem of not being able to transmit a large amount of data including the multiple pieces of information on the respective amounts of the electric power or electric energy in real-time. Instead, the conventional technology may transmit the information on the amounts of the electric energy acquired by respectively integrating multiple pieces of information on the electric power during a predetermined cycle to the conventional data management server.

Accordingly, some of the power providers, who periodically acquire the information on the amounts of the electric energy respectively integrated for the predetermined cycle, cannot obtain enough information on the electric power in real time, and thus, there is a problem of not being able to identify each of the loads being operated by each of the customers.

Thus, an advanced technology is needed which solves all the aforementioned problems.

SUMMARY

It is an object of the present disclosure to solve all the aforementioned problems.

It is another object of the present disclosure to provide a method for identifying each load by an energy meter based on a neural network.

It is still another object of the present disclosure to provide a method for allowing the energy meter to transmit load information and information on the amount of electric energy to a power provider.

It is still yet another object of the present disclosure to provide a method for allowing the power provider to acquire the load information regardless of a bandwidth of a communication network.

It is still yet another object of the present disclosure to provide a method for allowing the power provider to accurately predict any changes in the electric power demands based on the load information.

In order to accomplish the objects above, distinctive structures of the present disclosure are described as follows.

In accordance with one aspect of the present disclosure, there is provided a method for estimating one or more loads by an energy meter including a load estimation model based on a neural network, comprising steps of: (a) the energy meter sequentially generating multiple pieces of sampled supply electric power information by sampling information on electric power, supplied to a customer through one or more input lines of a distribution board, based on a predetermined sampling rate; (b) the energy meter sequentially inputting the multiple pieces of the sampled supply electric power information to the load estimation model and instructing the load estimation model to output load information which is a result of distinguishing each of the loads, being operated by the customer at a t-th time, wherein t is an integer bigger than or equal to 2, based on (t−k)-th sampled supply electric power information to t-th sampled supply electric power information, wherein k is an integer bigger than or equal to 1 and less than t, respectively corresponding to a (t−k)-th time to the t-th time, among the multiple pieces of the sampled supply electric power information; and (c) the energy meter (i) transmitting the load information and information on an amount of the electric energy to a data management server, wherein the information on the amount of the electric energy is acquired by integrating the electric power supplied to the customer during a time period including a specific period between the (t−k)-th time and the t-th time through the input lines, and (ii) instructing the data management server to monitor at least part of the information on the amount of the electric energy consumed by the customer, information on each sub-electric power for each of the loads, and information on each amount of sub-electric energy for each of the loads.

As one example, at the step of (b), the energy meter inputs the (t−k)-th sampled supply electric power information to the t-th sampled supply electric power information respectively to a 1-st input layer to a (k+1)-th input layer of the load estimation model, wherein the 1-st input layer to the (k+1)-th input layer are respectively corresponding to the (t−k)-th time to the t-th time, and instructs the load estimation model (i) to output each of (t−k)-th hidden status information to t-th hidden status information through each of a 1-st hidden layer to a (k+1)-th hidden layer, respectively corresponding to the 1-st input layer to the (k+1)-th input layer, by referring to (i–1) each of the (t–k)-th sampled supply electric power information to the t-th sampled supply electric power information respectively acquired from each of the 1-st input layer to the (k+1)-th input layer, and (i–2) each corresponding previous input information outputted from each corresponding previous hidden layer of each of a 2-nd hidden layer to the (k+1)-th hidden layer, and (ii) to output the load information which is the result of distinguishing each of the loads, being operated by the customer at the t-th time, based on the t-th hidden status information through an output layer corresponding to the (k+1)-th hidden layer.

As one example, before the step of (a), the method further comprising a step of: (a0) on condition that at least one optimal parameter of the load estimation model has been generated as a result of training the load estimation model by a learning device, in response to acquiring the optimal parameter from the learning device, the energy meter updating at least one current parameter of the load estimation model to the optimal parameter.

As one example, before the step of (a), the method further comprising a step of: (a01) the load estimation model (1) inputting 1-st sampled supply electric power information for training to (k+1)-th sampled supply electric power information for training into a 1-st input layer to a (k+1)-th input layer of the load estimation model, as multiple training data, wherein the 1-st sampled supply electric power information for training to the (k+1)-th sampled supply electric power information for training are generated respectively by sampling information on electric power for training corresponding to a (t–k)-th training time to a t-th training time, (2) instructing the load estimation model (i) to output each of 1-st hidden status information for training to (k+1)-th hidden status information for training through each of a 1-st hidden layer to a (k+1)-th hidden layer, respectively corresponding to the 1-st input layer to the (k+1)-th input layer, by referring to (i–1) each of the 1-st sampled supply electric power information for training to the (k+1)-th sampled supply electric power information for training respectively acquired from each of the 1-st input layer to the (k+1)-th input layer, and (i–2) each corresponding previous input information for training outputted from each corresponding previous hidden layer of each of a 2-nd hidden layer to the (k+1)-th hidden layer, and (ii) to output load information for training which is a result of distinguishing one or more loads for training, being operated by a customer for training at the t-th training time, based on the (k+1)-th hidden status information for training through an output layer corresponding to the (k+1)-th hidden layer, and (3) acquiring classification loss based on the load information for training and its corresponding GT load information, to thereby train the load estimation model by backpropagating the classification loss.

As one example, at the step of (c), the energy meter transmits the load information and the information on the amount of the electric energy to the data management server by using a Power Line Communication (PLC) technology.

As one example, the energy meter transmits (i) the load information and (ii) the information on the amount of the electric energy, information on active electric power, and information on reactive electric power, corresponding to at least part of the loads being operated by the customer, to the data management server.

In accordance with another aspect of the present disclosure, there is provided an energy meter for estimating one or more loads, wherein the energy meter includes a load estimation model based on a neural network, comprising: at least one memory that stores instructions; and at least one processor for performing processes of (I) sequentially generating multiple pieces of sampled supply electric power information by sampling information on electric power, supplied to a customer through one or more input lines of a distribution board, based on a predetermined sampling rate, (II) sequentially inputting the multiple pieces of the sampled supply electric power information to the load estimation model and instructing the load estimation model to output load information which is a result of distinguishing each of the loads, being operated by the customer at a t-th time, wherein t is an integer bigger than or equal to 2, based on (t–k)-th sampled supply electric power information to t-th sampled supply electric power information, wherein k is an integer bigger than or equal to 1 and less than t, respectively corresponding to a (t–k)-th time to the t-th time, among the multiple pieces of the sampled supply electric power information, and (III) (i) transmitting the load information and information on an amount of the electric energy to a data management server, wherein the information on the amount of the electric energy is acquired by integrating the electric power supplied to the customer during a time period including a specific period between the (t–k)-th time and the t-th time through the input lines, and (ii) instructing the data management server to monitor at least part of the information on the amount of the electric energy consumed by the customer, information on each sub-electric power for each of the loads, and information on each sub-amount of the electric energy for each of the loads.

As one example, at the process of (II), the processor inputs the (t–k)-th sampled supply electric power information to the t-th sampled supply electric power information respectively to a 1-st input layer to a (k+1)-th input layer of the load estimation model, wherein the 1-st input layer to the (k+1)-th input layer are respectively corresponding to the (t–k)-th time to the t-th time, and instructs the load estimation model (i) to output each of (t–k)-th hidden status information to t-th hidden status information through each of a 1-st hidden layer to a (k+1)-th hidden layer, respectively corresponding to the 1-st input layer to the (k+1)-th input layer, by referring to (i–1) each of the (t–k)-th sampled supply electric power information to the t-th sampled supply electric power information respectively acquired from each of the 1-st input layer to the (k+1)-th input layer, and (i–2) each corresponding previous input information outputted from each corresponding previous hidden layer of each of a 2-nd hidden layer to the (k+1)-th hidden layer, and (ii) to output the load information which is the result of distinguishing each of the loads, being operated by the customer at the t-th time, based on the t-th hidden status information through an output layer corresponding to the (k+1)-th hidden layer.

As one example, before the process of (I), the processor further performs a process of: (I-0) on condition that at least one optimal parameter of the load estimation model has been generated as a result of training the load estimation model by a learning device, in response to acquiring the optimal parameter from the learning device, updating at least one current parameter of the load estimation model to the optimal parameter.

As one example, before the process of (I), the processor further performs a process of: (I-01) (1) inputting 1-st sampled supply electric power information for training to (k+1)-th sampled supply electric power information for training into a 1-st input layer to a (k+1)-th input layer of the load estimation model, as multiple training data, wherein the 1-st sampled supply electric power information for training to the (k+1)-th sampled supply electric power information for training are generated respectively by sampling information on electric power for training corresponding to a (t−k)-th training time to a t-th training time, (2) instructing the load estimation model (i) to output each of 1-st hidden status information for training to (k+1)-th hidden status information for training through each of a 1-st hidden layer to a (k+1)-th hidden layer, respectively corresponding to the 1-st input layer to the (k+1)-th input layer, by referring to (i−1) each of the 1-st sampled supply electric power information for training to the (k+1)-th sampled supply electric power information for training respectively acquired from each of the 1-st input layer to the (k+1)-th input layer, and (i−2) each corresponding previous input information for training outputted from each corresponding previous hidden layer of each of a 2-nd hidden layer to the (k+1)-th hidden layer, and (ii) to output load information for training which is a result of distinguishing one or more loads for training, being operated by a customer for training at the t-th training time, based on the (k+1)-th hidden status information for training through an output layer corresponding to the (k+1)-th hidden layer, and (3) acquiring classification loss based on the load information for training and its corresponding GT load information, to thereby train the load estimation model by backpropagating the classification loss.

As one example, at the process of (III), the processor transmits the load information and the information on the amount of the electric energy to the data management server by using a Power Line Communication (PLC) technology.

As one example, the processor transmits (i) the load information and (ii) the information on the amount of the electric energy, information on active electric power, and information on reactive electric power, corresponding to at least part of the loads being operated by the customer, to the data management server.

In addition, recordable media readable by a computer for storing a computer program to execute the method of the present disclosure is further provided.

BRIEF DESCRIPTION OF THE DRAWINGS

The above and other objects and features of the present disclosure will become apparent from the following description of preferred embodiments given in conjunction with the accompanying drawings. The accompanying drawings used to explain example embodiments of the present disclosure are only part of example embodiments of the present disclosure and other drawings can be obtained based on the drawings by those skilled in the art of the present disclosure without inventive work.

DETAILED DESCRIPTION

Figure 1:
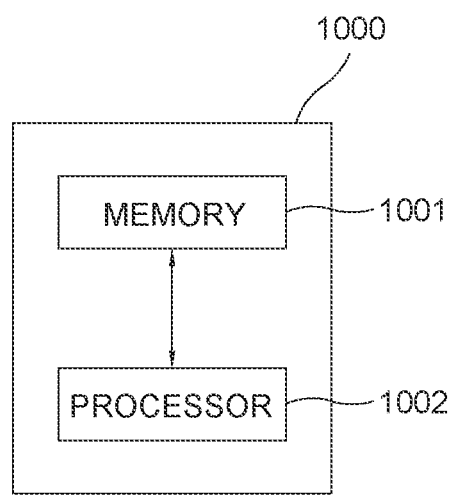
FIG. 1 is a drawing schematically illustrating an energy meter for estimating one or more loads being operated by a customer in accordance with one example embodiment of the present disclosure.

In the following detailed description, reference is made to the accompanying drawings that show, by way of illustration, specific embodiments in which the disclosure may be practiced. These embodiments are described in sufficient detail to enable those skilled in the art to practice the disclosure. It is to be understood that the various embodiments of the present disclosure, although different, are not necessarily mutually exclusive. For example, a particular feature, structure, or characteristic described herein in connection with one embodiment may be implemented within other embodiments without departing from the spirit and scope of the present disclosure. In addition, it is to be understood that the position or arrangement of individual elements within each disclosed embodiment may be modified without departing from the spirit and scope of the present disclosure. The following detailed description is, therefore, not to be taken in a limiting sense, and the scope of the present disclosure is defined only by the appended claims, appropriately interpreted, along with the full range of equivalents to which the claims are entitled. In the drawings, like numerals refer to the same or similar functionality throughout several aspects.

Besides, in the detailed description and claims of the present disclosure, a term "include" and its variations are not intended to exclude other technical features, additions, components or steps. Other objects, benefits and features of the present disclosure will be revealed to one skilled in the art, partially from the specification and partially from the implementation of the present disclosure. The following examples and drawings will be provided as examples but they are not intended to limit the present disclosure.

Moreover, the present disclosure covers all possible combinations of example embodiments indicated in this specification. It is to be understood that the various embodiments of the present disclosure, although different, are not necessarily mutually exclusive. For example, a particular feature, structure, or characteristic described herein in connection with one embodiment may be implemented within other embodiments without departing from the spirit and scope of the present disclosure. In addition, it is to be understood that the position or arrangement of individual elements within each disclosed embodiment may be modified without departing from the spirit and scope of the present disclosure. The following detailed description is, therefore, not to be taken in a limiting sense, and the scope of the present disclosure is defined only by the appended claims, appropriately interpreted, along with the full range of equivalents to which the claims are entitled. In the drawings, similar reference numerals refer to the same or similar functionality throughout the several aspects.

The headings and abstract of the present disclosure provided herein are for convenience only and do not limit or interpret the scope or meaning of the embodiments.

As used in this specification and the appended claims, the singular forms "a," "an," and "the" may include plural referents unless the content and context clearly dictates otherwise.

For reference, throughout the present disclosure, the phrase "for training" or "training" is added for terms related to the learning process.

To allow those skilled in the art to carry out the present disclosure easily, the example embodiments of the present disclosure by referring to attached diagrams will be explained in detail as shown below.

FIG. 1 is a drawing schematically illustrating an energy meter 1000. The energy meter 1000 may include a memory 1001 which stores one or more instructions for estimating one or more loads by using a load estimation model based on a neural network, and a processor 1002 which performs functions for the estimation of the loads by using the load estimation model based on the neural network in response to the instructions stored in the memory 1001.

Specifically, the energy meter 1000 may typically achieve a required system performance by using combinations of (i) at least one computing device, e.g., a computer processor, a memory, a storage, an input device, an output device, or any other conventional computing components, an electronic communication device such as a router or a switch, an electronic information storage system such as a network-attached storage (NAS) device and a storage area network (SAN) and (ii) at least one computer software such as any instructions that allow the computing device to function in a specific way.

Additionally, the processor 1002 of the energy meter 1000 may include hardware configuration of MPU (Micro Processing Unit) or CPU (Central Processing Unit), cache memory, data bus, etc. Additionally, the computing device may further include software configuration of OS and applications that achieve specific purposes.

However, the case in which the energy meter 1000 includes an integrated processor, which includes a medium, a processor and a memory, for implementing the present disclosure is not excluded.

Meanwhile, the memory 1001 of the energy meter 1000 may additionally store instructions related to various operations of the energy meter 1000, and the processor 1002 of the energy meter 1000 may perform the functions in response to the instructions stored in the memory 1001.

The above-mentioned will be described in detail by referring to FIG. 2.

Figure 2:
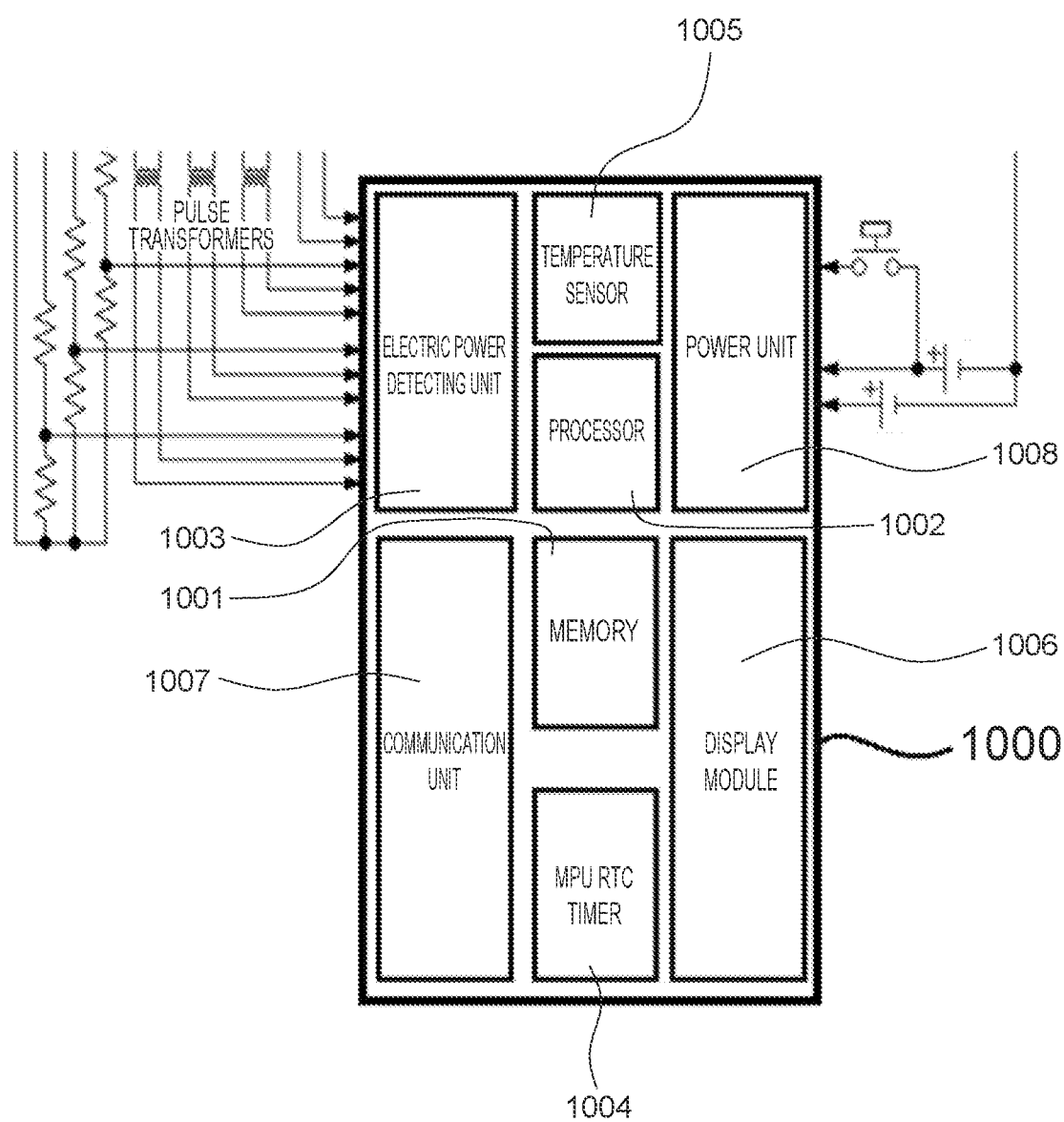
FIG. 2 is a drawing schematically illustrating the energy meter in detail for estimating the load being operated by the customer in accordance with one example embodiment of the present disclosure.

FIG. 2 is a drawing schematically illustrating the energy meter 1000 in detail for estimating one or more loads being operated by the customer in accordance with one example embodiment of the present disclosure.

For example, the processor 1002 of the energy meter 1000 may sequentially generate multiple pieces of sampled supply electric power information by sampling information on electric power supplied to a customer, at a predetermined sampling rate, through an electric power detecting unit 1003.

Also, the processor 1002 of the energy meter 1000 may (i) generate information on an amount of electric energy based on the sampled supply electric power information acquired by the electric power detecting unit 1003 and time information acquired by MPU RTC (Microprocessor Chips Real-Time Clock) Timers 1004, (ii) instruct a load estimation model to generate load information based on the sampled supply electric power information, and (iii) generate temperature information of the energy meter 1000 through at least one temperature sensor 1005.

For example, the processor 1002 of the energy meter 1000 may generate at least one of the following information: the current date and time, the periodic meter reading date, information on the cumulative active electric energy in the previous month, information on the cumulative lagging reactive electric energy in the previous month, information on the cumulative leading reactive electric energy in the previous month, information on peak electric power demand in the previous month, the date and time of the peak electric power demand in the previous month, the average power factor of the previous month, information on the current cumulative active electric energy, information on the current cumulative lagging reactive electric energy, information on the current cumulative leading reactive electric energy, information on the current peak electric power demand, the date and time of the current peak electric power demand, the current average power factor and the load information.

Herein, the aforementioned information generated by the processor 1002 of the energy meter 1000 are only some of many examples, and the present disclosure is not limited thereto.

And, the processor 1002 of the energy meter 1000 may display at least one of the aforementioned information by using a display module 1006 and transmit the same to another device (i.e., a data management server to be explained later) by using a communicating unit 1007.

Also, a power unit 1008 of the energy meter 1000 may supply operating power to the energy meter 1000.

Next, a method of estimating one or more loads by using the energy meter 1000 will be explained below.

Figure 3:
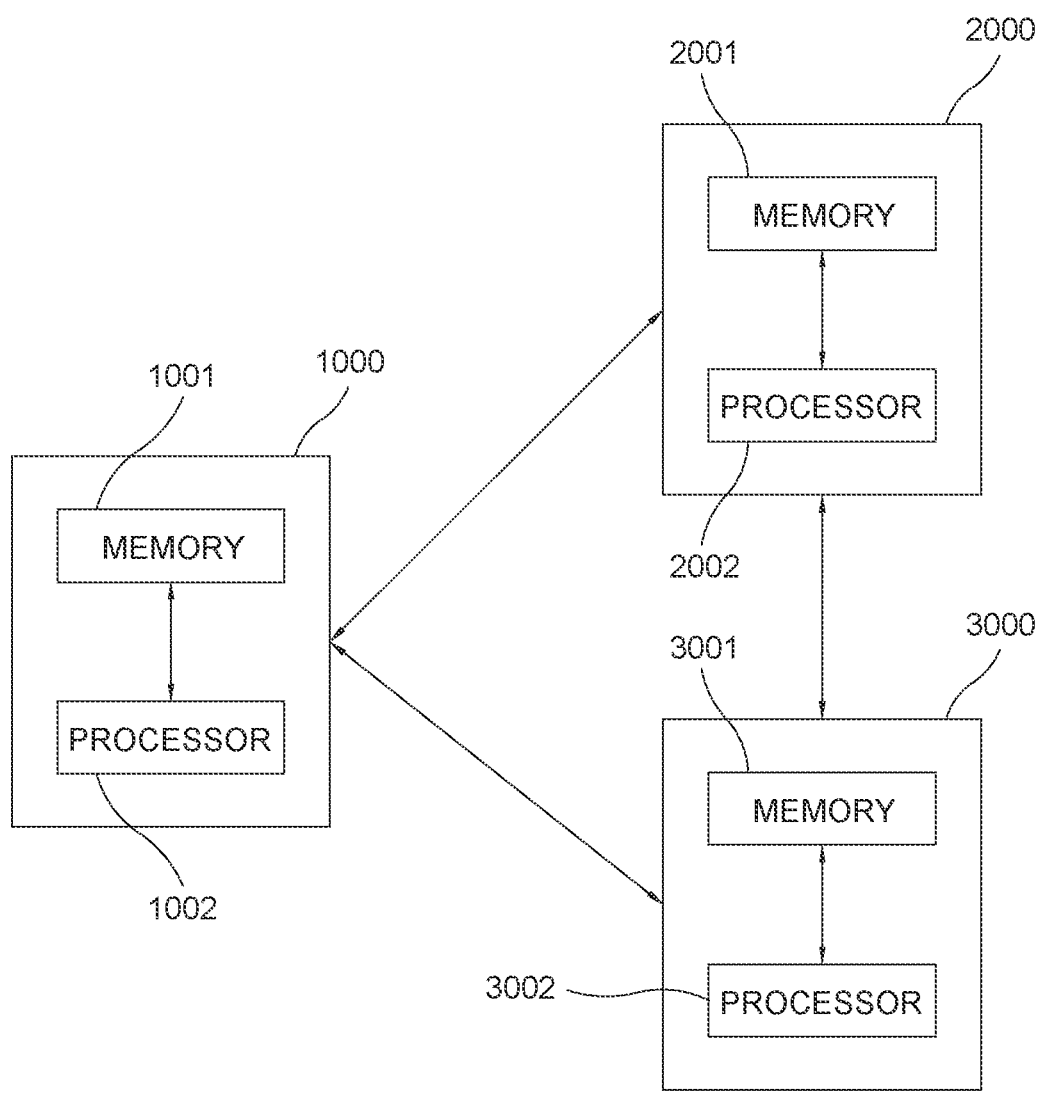
FIG. 3 is a drawing schematically illustrating a system comprised of the energy meter including a load estimation model based on a neural network, a learning device, and a data management server in accordance with one example embodiment of the present disclosure.

By referring to FIG. 3, on condition that at least one optimal parameter of the load estimation model has been generated as a result of training the load estimation model by a learning device 2000, in response to acquiring the optimal parameter from the learning device 2000, the energy meter 1000 may (i) update at least one current parameter of the load estimation model to the optimal parameter, (ii) output load information which is a result of distinguishing each of the loads, being operated by the customer, (iii) transmit the load information and information on an amount of the electric energy to the data management server 3000, and (iv) instruct the data management server 3000 to monitor at least part of the information on the amount of the electric energy consumed by the customer, information on each sub-electric power for each of the loads, and information on each amount of sub-electric energy for each of the loads.

Herein, the learning device 2000 may include a memory 2001 which stores one or more instructions for training the load estimation model and a processor 2002 which performs functions for training the load estimation model based on the neural network in response to the instructions stored in the memory 2001.

Also, the data management server 3000 may include a memory 3001 which stores one or more instructions for monitoring information on the amount of the electric energy consumed by the customer based on the load information and the information on the amount of the electric energy and a processor 3002 which performs functions for the monitoring of the information of the amount of the electric energy consumed by the customer based on the load information and the information on the amount of the electric energy in response to the instructions stored in the memory 3001.

Figure 4:
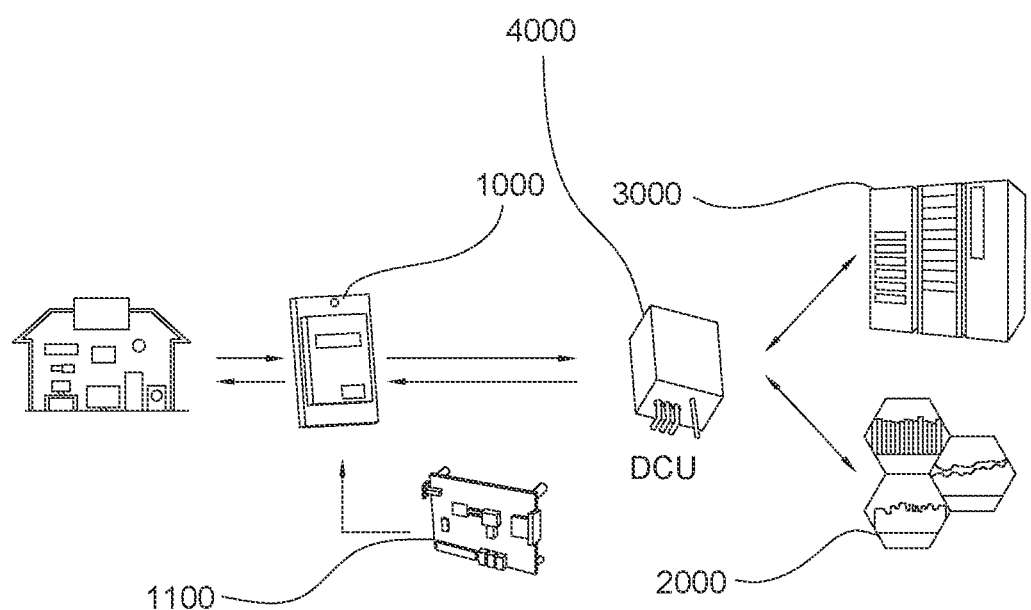
FIG. 4 is a drawing illustrating interactions among the energy meter, the learning device, and the data management server in accordance with one example embodiment of the present disclosure.

By referring to FIG. 4, in accordance with one example embodiment of the present disclosure, the energy meter 1000 may transmit the load information and the amount of the electric energy corresponding to the electric power supplied to the customer to a Data Concentration Unit (DCU) 4000 though a PLC modem 1100 embedded in the energy meter 1000, to thereby instruct the DCU 4000 to transmit the load information and the information on the amount of the electric energy to the data management server 3000.

By referring to FIG. 4, it is illustrated that the learning device 2000 is communicating with the energy meter 1000 by using the PLC technology, but the present disclosure is not limited thereto, and the learning device 2000 may communicate with the energy meter 1000 by using at least one of various wired or wireless communicating technologies.

In the above, detailed descriptions on the energy meter 1000, the learning device 2000 and the data management server 3000 have been explained.

For reference, throughout the present disclosure, the phrase "for training" or "training" is added for terms related to the learning process.

Hereinafter, a method of the learning device 2000 training the load estimation model and a method of the energy meter 1000 instructing the load estimation model to output the load information, e.g., the identity of each of the loads, will be explained with details.

First of all, on condition that the energy meter 1000 has been installed at a customer for training, the energy meter 1000 may sequentially generate multiple pieces of sampled supply electric power information for training by sampling information on electric power for training, supplied to the customer for training, based on a predetermined sampling rate.

Herein, the learning device 2000 may be a device for training the load estimation model, but the present disclosure is not limited thereto. The learning device 2000 may be configured as being separated with the data management server 3000 or being included in the data management server 3000. Also, the learning device 2000 may acquire the sampled supply electric power information for training from the energy meter 1000.

Figure 5:
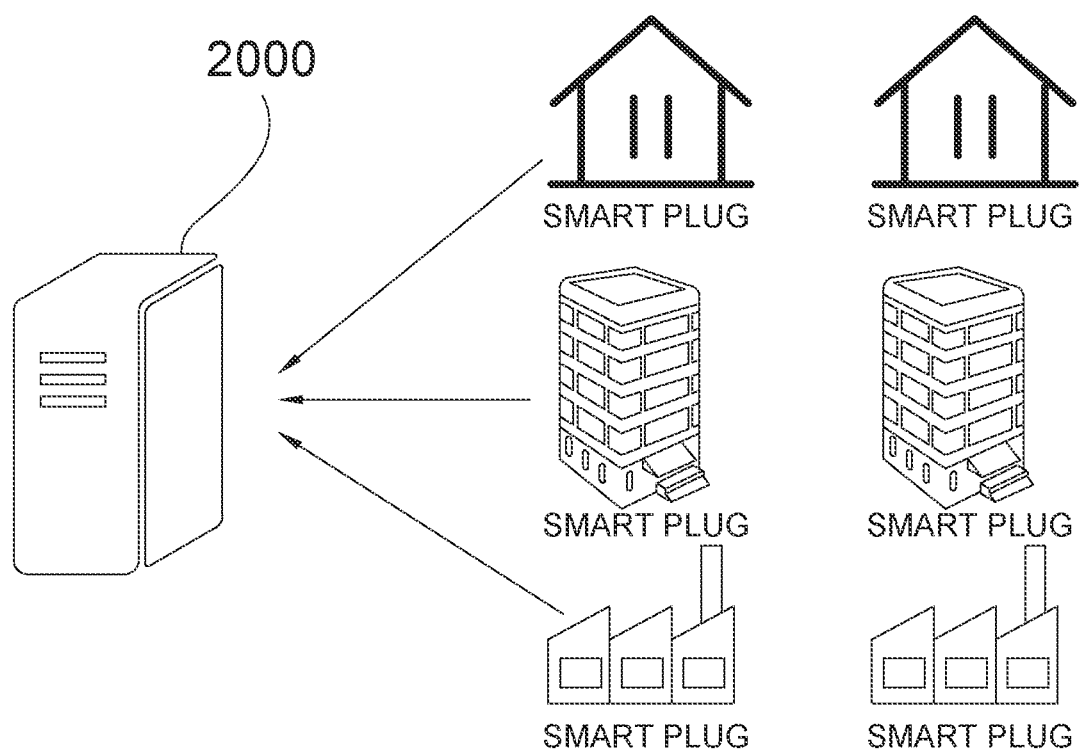
FIG. 5 is a drawing schematically illustrating a process of the learning device acquiring multiple pieces of sampled supply electric power information for training from a plurality of the energy meter installed at a plurality of customers for training.

By referring to FIG. 5, in accordance with one example embodiment of the present disclosure, the learning device 2000 may acquire multiple pieces of the sampled supply electric power information for training from multiple energy meters respectively installed at multiple customers for training.

Herein, the data management server 3000, to be explained later, may acquire a limited amount of information from the energy meter 1000 due to the narrow bandwidth. Unlike that, the learning device 2000 may acquire a large amount of the sampled supply electric power information for training by using at least one of various wired or wireless communicating technologies from the energy meter 1000.

And, the learning device 2000 may input 1-st sampled supply electric power information for training to (k+1)-th sampled supply electric power information for training into a 1-st input layer to a (k+1)-th input layer of the load estimation model, as multiple training data. Herein the 1-st sampled supply electric power information for training to the (k+1)-th sampled supply electric power information for training are generated respectively by sampling information on electric power for training corresponding to a (t−k)-th training time to a t-th training time.

Herein, the load estimation model may be based on a neural network. For example, the load estimation model may be a recurrent neural network (RNN) such as a long short-term memory network (LSTM).

And, the learning device 2000 may instruct the load estimation model (i) to output each of 1-st hidden status information for training to (k+1)-th hidden status information for training through each of a 1-st hidden layer to a (k+1)-th hidden layer, respectively corresponding to the 1-st input layer to the (k+1)-th input layer, by referring to (i−1) each of the 1-st sampled supply electric power information for training to the (k+1)-th sampled supply electric power information for training respectively acquired from each of the 1-st input layer to the (k+1)-th input layer, and (i−2) each corresponding previous input information for training outputted from each corresponding previous hidden layer of each of a 2-nd hidden layer to the (k+1)-th hidden layer. Since the RNN is a well-known technology, the contents of the RNN should be interpreted as being incorporated in the specification. Further, the correspondence between the 1-st input layer to the (k+1)-th input layer and the (t−k)-th time to the t-th time can be easily understood from the contents of the RNN.

Meanwhile, the load estimation model may output i-th hidden status information for training through an i-th hidden layer by applying a tanh operation to (i) a result which is acquired by applying a weight $W_x$ to i-th sampled supply electric power information for training acquired from an i-th input layer and (ii) a result which is acquired by applying a weight $W_h$ to i-th previous input information for training outputted from an (i−1)-th hidden layer. Herein, the (i−1)-th hidden layer is a hidden layer just prior to the i-th hidden layer. Further, the i-th hidden status information for training, outputted from the i-th hidden layer, may be inputted to an (i+1)-th hidden layer.

Since there is no previous hidden layer just prior to the 1-st hidden layer, the load estimation model may apply the tanh operation to a result which is acquired by applying a weight $W_x$ to 1-st sampled supply electric power information for training. Herein the 1-st sampled supply electric power information for training is acquired from the 1-st input layer through the 1-st hidden layer.

Next, the learning device 2000 may output load information for training which is a result of distinguishing one or more loads for training, being operated by a customer for training at the t-th training time, based on the (k+1)-th hidden status information for training through an output layer corresponding to the (k+1)-th hidden layer.

For example, the learning device 2000 may output the load information for training which is a result of distinguishing one or more loads for training, being operated by the customer for training at the t-th training time by applying the weight $W_y$ to the (k+1)-th hidden status information for training, through the output layer.

Herein, the load information for training may be a result of classifying each of the loads for training being operated in the customer for training at the t-th training time. The load information for training may be interpreted as one or more vectors.

And, the learning device 2000 may acquire classification loss by referring to the load information for training and its corresponding GT (Ground Truth) load information.

For example, multiple loads operated in the customer for training are assumed to include 5 loads, e.g., a refrigerator, a television, an electric heater, an air-conditioner, and a laundry machine, the learning device 2000 may output the load information for training, as a result of classifying a specific load being currently operated as the air-conditioner, by referring to the 1-st sampled supply electric power information for training to the (k+1)-th sampled supply electric power information for training. Herein, the 1-st sampled supply electric power information for training to the (k+1)-th sampled supply electric power information for training are generated respectively by sampling the information on the electric power for training corresponding to the (t−k)-th training time to the t-th training time.

The outputted load information for training may be expressed as follows.

[0.05, 0.05, 0.1, 0.7, 0.1]

Also, if the specific load being actually operated by the customer for training between the (t−k)-th training time and the t-th training time is determined to be same as the air-conditioner, the GT load information may be expressed as follows.

[0, 0, 0, 1, 0]

In the above example, the 5 loads are used for the convenience of explanation, but the number of the loads is not limited thereto.

Also, the learning device 2000 may allow the load estimation model to estimate each of the loads, but the present disclosure is not limited thereto.

For example, a flat iron, a hairdryer, and a heater included in a category of 'electrically heating equipment' may have similar characteristics related to the electric power.

In this case, the learning device 2000 may instruct the load estimation model to output (i) each of pieces of the load information corresponding to each of the flat iron, the hairdryer, and the heater or (ii) integrated load information corresponding to 'electrically heating equipment' comprised of the flat iron, the hairdryer, and the heater.

And, the learning device 2000 may train the load estimation model by backpropagating the classification loss.

For example, the learning device 2000 may train the values of parameters, $W_x$, $W_h$ and $W_y$, of the load estimation model.

That is, on condition that at least one optimal parameter of the load estimation model, for distinguishing each of the loads for training being operated in the customer for training, has been generated as a result of training the load estimation model by the learning device 2000, the energy meter 1000 installed in the customer may acquire the optimal parameter.

And, the energy meter 1000 may sequentially generate multiple pieces of sampled supply electric power information by sampling the information on the electric power, supplied to the customer through one or more input lines of the distribution board, based on a predetermined sampling rate.

For example, the predetermined sampling rate may be 1/60 seconds, but the present disclosure is not limited thereto, and an appropriate sampling rate such as 1/20 seconds may be determined for the identification of each load.

Next, the energy meter 1000 may sequentially input the multiple pieces of the sampled supply electric power information to the load estimation model and instruct the load estimation model to output load information which is a result of distinguishing each of the loads, being operated by the customer at a t-th time, based on (t−k)-th sampled supply electric power information to t-th sampled supply electric power information, respectively corresponding to a (t−k)-th time to the t-th time, among the multiple pieces of the sampled supply electric power information.

Herein, t is an integer bigger than or equal to 2 and k is an integer bigger than or equal to 1 and less than t.

For the reference, a time period between the (t−k)-th time and the t-th time may be set as 60 seconds, but the present disclosure is not limited thereto, and the time period may be set as longer or shorter than 60 seconds.

For example, the energy meter 1000 may input the (t−k)-th sampled supply electric power information to the t-th sampled supply electric power information respectively to the 1-st input layer to the (k+1)-th input layer of the load estimation model. Herein the 1-st input layer to the (k+1)-th input layer are respectively corresponding to the (t−k)-th time to the t-th time.

And, the energy meter 1000 may instruct the load estimation model to output each of (t−k)-th hidden status information to t-th hidden status information through each of the 1-st hidden layer to the (k+1)-th hidden layer, respectively corresponding to the 1-st input layer to the (k+1)-th input layer, by referring to (1) each of the (t−k)-th sampled supply electric power information to the t-th sampled supply electric power information respectively acquired from each of the 1-st input layer to the (k+1)-th input layer, and (2) each corresponding previous input information outputted from each corresponding previous hidden layer of each of the 2-nd hidden layer to the (k+1)-th hidden layer.

And, the energy meter 1000 may output the load information which is the result of distinguishing each of the loads, being operated by the customer at the t-th time, based on the t-th hidden status information through the output layer corresponding to the (k+1)-th hidden layer.

In accordance with one example embodiment of the present disclosure, the energy meter 1000 may accurately output the load information based on the multiple pieces of sampled supply electric power information generated by sampling the information of the electric power according to a short sampling rate such as 1/60 seconds. After then, the energy meter 1000 may transmit the load information, outputted during a current transmission cycle such as 10 minutes, and information of the amount of the electric energy integrated up to the current transmission cycle to the data management server 3000.

Herein, the information on the amount of the electric energy integrated up to the current transmission cycle may include information on the summed value of (i) first information on the amount of the electric energy accumulated up to its previous transmission cycle prior to the current transmission cycle and (ii) second information on the amount of the electric energy during the current transmission cycle.

For example, in case that the current transmission cycle is set as 10 minutes, the information on the amount of the electric energy accumulated up to the previous transmission cycle prior to the current transmission cycle is 10 kWh, and the amount of the electric energy calculated by using the sampled electric power information during the current transmission cycle is 0.1 kWh, the energy meter 1000 may transmit the summation of the aforementioned electrical energy, i.e., 10.1 kWh, as the total amount of the electric energy, to the data management server 3000.

However, the present disclosure is not limited thereto.

As another example, the energy meter 1000 may transmit the load information and information on the amount of the electric energy during the current transmission cycle to the data management server 3000.

In this case, the information on the amount of the electric energy during the current transmission cycle may be transmitted to the data management server 3000 and then the data management server 3000 may calculate the total amount of the electric energy of the customer by adding (i) the information on the amount of the electric energy during the current transmission cycle to (ii) the information on the amount of the electric energy accumulated up to its previous transmission cycle prior to the current transmission cycle.

In detail, the energy meter 1000 may (1) transmit the information on the amount of the electric energy during the current transmission cycle, i.e., 0.1 kHw, to the data management server 3000, and (2) instruct the data management server 3000 to calculate the total amount of the electric energy of the customer as 10.1 kWh by adding the amount of the electric energy during the current transmission cycle, i.e., 0.1 kWh, to the amount of the electric energy accumulated up to the previous transmission cycle prior to the current transmission cycle, i.e., 10 kWh.

Herein, the energy meter 1000 may transmit (i) the load information and (ii) the information on the amount of the electric energy, information on active electric power, and information on reactive electric power, corresponding to at least part of the loads being operated by the customer, to the data management server 3000.

Additionally, the information on the amount of the electric energy may include status information of the energy meter 1000 and information on the power factor.

Herein, the energy meter 1000 may transmit (i) the load information and (ii) the information on the amount of the electric energy, information on active electric power, and information on reactive electric power to the data management server 3000 by using a Power Line Communication (PLC) technology.

For example, the energy meter 1000 may transmit (i) the load information and (ii) the information on the amount of the electric energy, information on active electric power, and information on reactive electric power to the DCU 4000 and instruct the DCU 4000 to transmit the same to the data management server 3000 by using at least one wired or wireless communicating technology.

In a Table 1 below, examples of the load information and the information on the amount of the electric energy, information on active electric power, and information on reactive electric power, being transmitted by the energy meter 1000 through the PCL technology are presented.

TABLE 1

| Field name | Size | Type | Description |
| --- | --- | --- | --- |
| Count | 2 Bytes | HEX | the Number of Dump packet of Reading Data |
| MID | 11 Bytes | ASCII | Meter ID |
| Dtype | 1 Bytes | HEX | Data type Code<br>0x01: Current Meter Reading,<br>0x02: Periodic Meter Reading |
| ITime | 7 Bytes | BCD | DCU Time at receiving meter reading of the subject meter |
| MTime | 7 Bytes | BCD | Current Meter Reading:<br>Time of Reading<br>Periodic Meter Reading:<br>Periodic Reading Time |
| APT | 4 Bytes | HEX | Active Electric Power (Total) |
| RPT | 4 Bytes | HEX | Reactive Electric Power (Total) |
| PFT | 4 Bytes | HEX | Power Factor (Total) |
| SHID | 4 Bytes | HEX | Load Information |

Next, the data management server 3000 may monitor at least part of the information on the amount of the electric energy consumed by the customer, information on each sub-electric power for each of the loads, and information on each amount of sub-electric energy for each of the loads.

Figure 6:
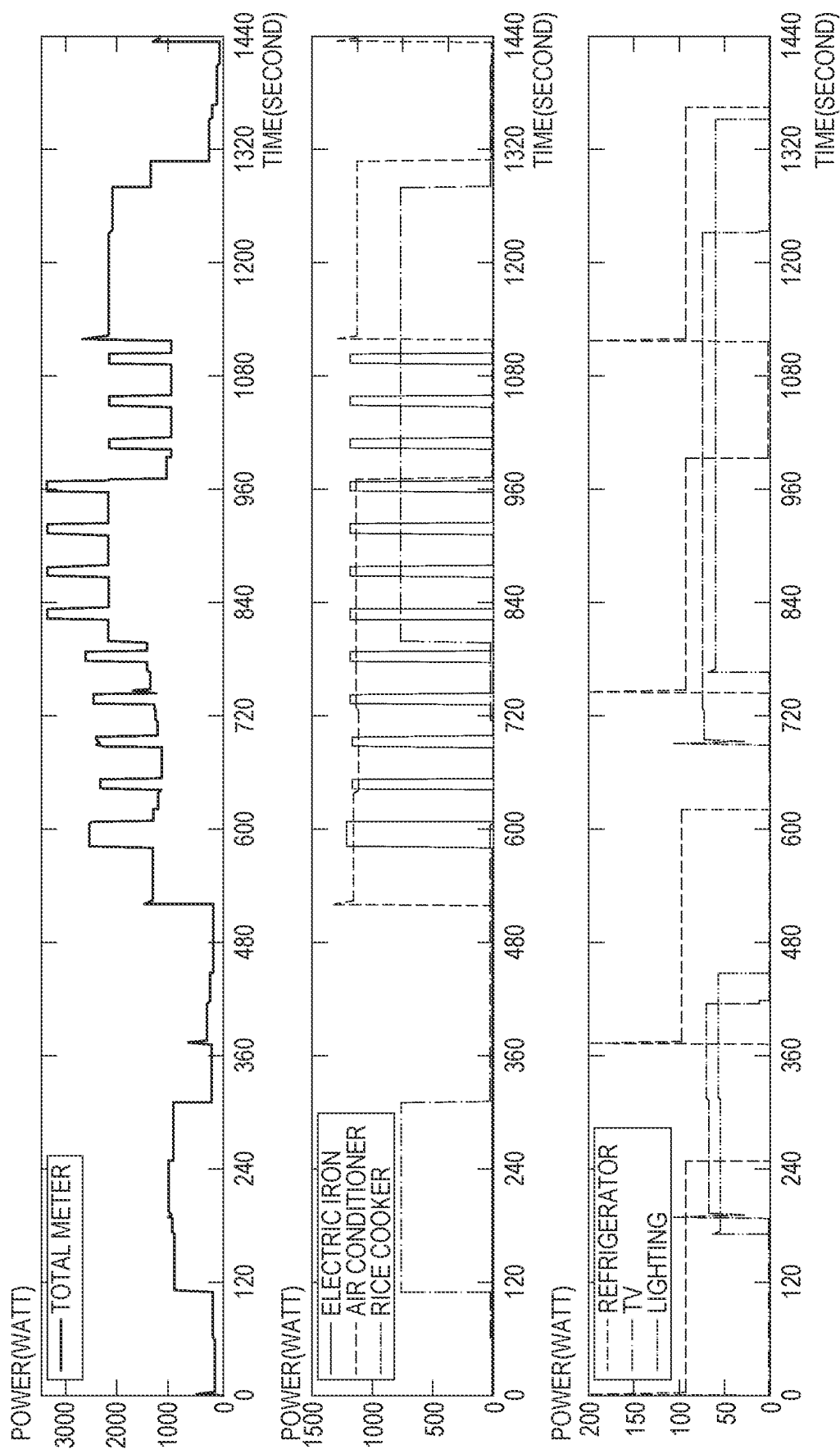
FIG. 6 is a drawing schematically illustrating a result of analyzing information on amounts of the electric power or the electric energy based on load information.

FIG. 6 is a drawing schematically illustrating a result of analyzing information on amounts of the electric power and the electric energy based on load information.

By referring to FIG. 6, (i) a total amount of the electric energy consumed by the customer (in the first graph) and (ii) each of the information on each sub-electric power for each of the loads and information on each amount of sub-electric energy for each of the loads (in the second graph and in the third graph) can be read.

Conventionally, in order to acquire the load information, the power provider (i.e., the conventional data management server) has to acquire vast amount of information on the electric power or the electric energy and has to analyze the same. On the other hand, the load estimation process of the present disclosure is very efficient since the present disclosure allows the power provider to acquire the load information without obtaining the vast amount of information on the electric power or the electric energy.

That is, the power provider can acquire the load information of the customer without a separate communication network for acquiring the vast amount of information on the electric power or the electric energy, since the present disclosure can easily acquire the load information from the energy meter 1000 including the load estimation model.

Also, the power providers can provide various services for the customers by analyzing the acquired load information.

For example, the power providers may obtain the information on the amount of the electric energy consumed by each of the loads in a specific customer by analyzing the acquired load information and support the specific customer to be able to manage the usage of the electric energy in a more efficient way by providing the said information to the customer.

For example, the providers can charge the customer differently with reference to the analyzed result on the load information.

Specifically, in case first load information is related to at least one agricultural load being used by a specific customer for agricultural use and second load information is related to at least one ordinary load being used by the specific customer for daily uses, the power provider may apply different charge rates for a first amount of the electric energy consumed by the agricultural load and a second amount of the electric energy consumed by the ordinary load.

Or, in case a certain load (i.e., air-conditioner) is used more frequently during a certain period (i.e., summer), the power provider may apply different charge rates for a third amount of the electric energy consumed by the certain load during the certain period and a fourth amount of the electric energy consumed by the certain load during the periods other than the certain period.

In another example, when an abnormal operation caused by a specific load is detected based on the analyzed result on the load information and the information on the amount of the electric energy, the data management server 3000 can transmit information on the specific load to the specific customer.

Accordingly, the data management server 3000 can provide various services for the customers by monitoring at least part of the information on the amount of the electric energy consumed by the customer, information on each sub-electric power for each of the loads, and information on each amount of sub-electric energy for each of the loads.

Furthermore, the present disclosure can be effective in mitigating the global warming by preventing unnecessary consumption of the electric energy, thereby reducing the amount of carbon emission essentially produced in the conventional processes of producing the electric energy.

The present disclosure has an effect of providing a method for identifying each of the loads by the energy meter 1000 based on the neural network.

The present disclosure has another effect of providing a method for allowing the energy meter 1000 to transmit the load information and the information on the amount of the electric energy to the power provider.

The present disclosure has still another effect of providing a method for allowing the power provider to acquire the load information regardless of the bandwidth of the communication network.

The present disclosure has still another effect of providing a method for allowing the power provider to accurately predict any changes in the electric power demands based on the load information.

The embodiments of the present disclosure as explained above can be implemented in a form of executable program command through a variety of computer means recordable in computer readable media. The computer readable media may include solely or in combination, program commands, data files, and data structures. The program commands recorded in the media may be components specially designed for the present disclosure or may be usable to those skilled in the art in a field of computer software. Computer readable media may include magnetic media such as hard disk, floppy disk, and magnetic tape, optical media such as CD-ROM and DVD, magneto-optical media such as floptical disk and hardware devices such as ROM, RAM, and flash memory specially designed to store and carry out program commands. Program commands may include not only a machine language code made by a complier but also a high-level code that can be used by an interpreter etc., which may be executable by a computer. The aforementioned hardware device can work as more than a software module to perform the action of the present disclosure and they can do the same in the opposite case.

As seen above, the present disclosure has been explained by specific matters such as detailed components, limited embodiments, and drawings. They have been provided only to help more general understanding of the present disclosure. It, however, will be understood by those skilled in the art that various changes and modification may be made from the description without departing from the spirit and scope of the disclosure as defined in the following claims.

Accordingly, the thought of the present disclosure must not be confined to the explained embodiments, and the following patent claims as well as everything including variations equal or equivalent to the patent claims pertain to the category of the thought of the present disclosure.

What is claimed is:

1. A method for estimating one or more loads by an energy meter including a load estimation model based on a neural network, comprising steps of:
   (a) the energy meter sequentially generating multiple pieces of sampled supply electric power information by sampling information on electric power, supplied to a customer through one or more input lines of a distribution board, based on a predetermined sampling rate;
   (b) the energy meter sequentially inputting the multiple pieces of the sampled supply electric power information to the load estimation model and instructing the load estimation model to output load information which is a result of distinguishing each of the loads, being operated by the customer at a t-th time, wherein t is an integer bigger than or equal to 2, based on (t−k)-th sampled supply electric power information to t-th sampled supply electric power information, wherein k is an integer bigger than or equal to 1 and less than t, respectively corresponding to a (t−k)-th time to the t-th time, among the multiple pieces of the sampled supply electric power information; and
   (c) the energy meter (i) transmitting the load information and information on an amount of the electric energy to a data management server, wherein the information on the amount of the electric energy is acquired by integrating the electric power supplied to the customer during a time period including a specific period between the (t−k)-th time and the t-th time through the input lines, and (ii) instructing the data management server to monitor at least part of the information on the amount of the electric energy consumed by the customer, information on each sub-electric power for each of the loads, and information on each amount of sub-electric energy for each of the loads,
   wherein the transmitted load information is used by the customer or a provider of the electric power supplied to the customer to control use or management of the electric energy.

2. The method of claim 1, wherein, at the step of (b), the energy meter inputs the (t−k)-th sampled supply electric power information to the t-th sampled supply electric power information respectively to a 1-st input layer to a (k+1)-th input layer of the load estimation model, wherein the 1-st input layer to the (k+1)-th input layer are respectively corresponding to the (t−k)-th time to the t-th time, and instructs the load estimation model (i) to output each of (t−k)-th hidden status information to t-th hidden status information through each of a 1-st hidden layer to a (k+1)-th hidden layer, respectively corresponding to the 1-st input layer to the (k+1)-th input layer, by referring to (i−1) each of the (t−k)-th sampled supply electric power information to the t-th sampled supply electric power information respectively acquired from each of the 1-st input layer to the (k+1)-th input layer, and (i−2) each corresponding previous input information outputted from each corresponding previous hidden layer of each of a 2-nd hidden layer to the (k+1)-th hidden layer, and (ii) to output the load information which is the result of distinguishing each of the loads, being operated by the customer at the t-th time, based on the t-th hidden status information through an output layer corresponding to the (k+1)-th hidden layer.

3. The method of claim 1, before the step of (a), further comprising a step of: (a0) on condition that at least one optimal parameter of the load estimation model has been generated as a result of training the load estimation model by a learning device, in response to acquiring the optimal parameter from the learning device, the energy meter updating at least one current parameter of the load estimation model to the optimal parameter.

4. The method of claim 3, before the step of (a), further comprising a step of: (a01) the load estimation model (1) inputting 1-st sampled supply electric power information for training to (k+1)-th sampled supply electric power information for training into a 1-st input layer to a (k+1)-th input layer of the load estimation model, as multiple training data, wherein the 1-st sampled supply electric power information for training to the (k+1)-th sampled supply electric power information for training are generated respectively by sampling information on electric power for training corresponding to a (t−k)-th training time to a t-th training time, (2) instructing the load estimation model (i) to output each of 1-st hidden status information for training to (k+1)-th hidden status information for training through each of a 1-st hidden layer to a (k+1)-th hidden layer, respectively corresponding to the 1-st input layer to the (k+1)-th input layer, by referring to (i−1) each of the 1-st sampled supply electric power information for training to the (k+1)-th sampled supply electric power information for training respectively acquired from each of the 1-st input layer to the (k+1)-th input layer, and (i–2) each corresponding previous input information for training outputted from each corresponding previous hidden layer of each of a 2-nd hidden layer to the (k+1)-th hidden layer, and (ii) to output load information for training which is a result of distinguishing one or more loads for training, being operated by a customer for training at the t-th training time, based on the (k+1)-th hidden status information for training through an output layer corresponding to the (k+1)-th hidden layer, and (3) acquiring classification loss based on the load information for training and its corresponding Ground Truth (GT) load information, to thereby train the load estimation model by backpropagating the classification loss.

5. The method of claim 1, wherein, at the step of (c), the energy meter transmits the load information and the information on the amount of the electric energy to the data management server by using a Power Line Communication (PLC) technology.

6. The method of claim 1, wherein the energy meter transmits (i) the load information and (ii) the information on the amount of the electric energy, information on active electric power, and information on reactive electric power, corresponding to at least part of the loads being operated by the customer, to the data management server.

7. An energy meter for estimating one or more loads, wherein the energy meter includes a load estimation model based on a neural network, comprising:
at least one memory that stores instructions; and
at least one processor configured to execute the instructions to perform or support another device to perform processes of: (I) sequentially generating multiple pieces of sampled supply electric power information by sampling information on electric power, supplied to a customer through one or more input lines of a distribution board, based on a predetermined sampling rate, (II) sequentially inputting the multiple pieces of the sampled supply electric power information to the load estimation model and instructing the load estimation model to output load information which is a result of distinguishing each of the loads, being operated by the customer at a t-th time, wherein t is an integer bigger than or equal to 2, based on (t–k)-th sampled supply electric power information to t-th sampled supply electric power information, wherein k is an integer bigger than or equal to 1 and less than t, respectively corresponding to a (t–k)-th time to the t-th time, among the multiple pieces of the sampled supply electric power information, and (III) (i) transmitting the load information and information on an amount of the electric energy to a data management server, wherein the information on the amount of the electric energy is acquired by integrating the electric power supplied to the customer during a time period including a specific period between the (t–k)-th time and the t-th time through the input lines, and (ii) instructing the data management server to monitor at least part of the information on the amount of the electric energy consumed by the customer, information on each sub-electric power for each of the loads, and information on each sub-amount of the electric energy for each of the loads,
wherein the transmitted load information is used by the customer or a provider of the electric power supplied to the customer to control use or management of the electric energy.

8. The energy meter of claim 7, wherein, at the process of (II), the processor inputs the (t–k)-th sampled supply electric power information to the t-th sampled supply electric power information respectively to a 1-st input layer to a (k+1)-th input layer of the load estimation model, wherein the 1-st input layer to the (k+1)-th input layer are respectively corresponding to the (t–k)-th time to the t-th time, and instructs the load estimation model
(i) to output each of (t–k)-th hidden status information to t-th hidden status information through each of a 1-st hidden layer to a (k+1)-th hidden layer, respectively corresponding to the 1-st input layer to the (k+1)-th input layer, by referring to (i–1) each of the (t–k)-th sampled supply electric power information to the t-th sampled supply electric power information respectively acquired from each of the 1-st input layer to the (k+1)-th input layer, and (i–2) each corresponding previous input information outputted from each corresponding previous hidden layer of each of a 2-nd hidden layer to the (k+1)-th hidden layer, and
(ii) to output the load information which is the result of distinguishing each of the loads, being operated by the customer at the t-th time, based on the t-th hidden status information through an output layer corresponding to the (k+1)-th hidden layer.

9. The energy meter of claim 7, wherein, before the process of (I), the processor further performs a process of:
(I-0) on condition that at least one optimal parameter of the load estimation model has been generated as a result of training the load estimation model by a learning device, in response to acquiring the optimal parameter from the learning device, updating at least one current parameter of the load estimation model to the optimal parameter.

10. The energy meter of claim 9, wherein, before the process of (I), the processor further performs a process of:
(I-01) the load estimation model
(1) inputting 1-st sampled supply electric power information for training to (k+1)-th sampled supply electric power information for training into a 1-st input layer to a (k+1)-th input layer of the load estimation model, as multiple training data, wherein the 1-st sampled supply electric power information for training to the (k+1)-th sampled supply electric power information for training are generated respectively by sampling information on electric power for training corresponding to a (t–k)-th training time to a t-th training time,
(2) instructing the load estimation model (i) to output each of 1-st hidden status information for training to (k+1)-th hidden status information for training through each of a 1-st hidden layer to a (k+1)-th hidden layer, respectively corresponding to the 1-st input layer to the (k+1)-th input layer, by referring to (i–1) each of the 1-st sampled supply electric power information for training to the (k+1)-th sampled supply electric power information for training respectively acquired from each of the 1-st input layer to the (k+1)-th input layer, and (i–2) each corresponding previous input information for training outputted from each corresponding previous hidden layer of each of a 2-nd hidden layer to the (k+1)-th hidden layer, and (ii) to output load information for training which is a result of distinguishing one or more loads for training, being operated by a customer for training at the t-th training time, based on the (k+1)-th hidden status information for training through an output layer corresponding to the (k+1)-th hidden layer, and (3) acquiring classification loss based on the load information for training and its corresponding Ground Truth (GT) load information, to thereby train the load estimation model by backpropagating the classification loss.

11. The energy meter of claim 7, wherein, at the process of (III), the processor transmits the load information and the information on the amount of the electric energy to the data management server by using a Power Line Communication (PLC) technology.

12. The energy meter of claim 7, wherein the processor transmits (i) the load information and (ii) the information on the amount of the electric energy, information on active electric power, and information on reactive electric power, corresponding to at least part of the loads being operated by the customer, to the data management server.

13. The method of claim 1, wherein the transmitted load information is used by the provider of the electric power to charge the customer differently with reference to an analyzed result of the transmitted load information.

14. The method of claim 1, wherein the transmitted load information is used by the provider of the electric power to provide services for the customer.

15. The method of claim 1, wherein the transmitted load information is used by the customer to manage usage of the electric energy.

16. The energy meter of claim 7, wherein the transmitted load information is used by the provider of the electric power to charge the customer differently with reference to an analyzed result of the transmitted load information.

17. The energy meter of claim 7, wherein the transmitted load information is used by the provider of the electric power to provide services for the customer.

18. The energy meter of claim 7, wherein the transmitted load information is used by the customer to manage usage of the electric energy.

* * * * *